(12) United States Patent
Peloza et al.

(10) Patent No.: US 7,695,329 B2
(45) Date of Patent: Apr. 13, 2010

(54) METHOD OF ATTACHING A SOLDER ELEMENT TO CONTACT AND THE CONTACT ASSEMBLY FORMED THEREBY

(75) Inventors: Kirk B. Peloza, Naperville, IL (US); Richard A. Faje, Darien, IL (US); Ronald C. Hodge, Aurora, IL (US); Jon S. Gould, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/662,558

(22) PCT Filed: Sep. 15, 2005

(86) PCT No.: PCT/US2005/033238

§ 371 (c)(1),
(2), (4) Date: Dec. 26, 2007

(87) PCT Pub. No.: WO2006/032035

PCT Pub. Date: Mar. 23, 2006

(65) Prior Publication Data

US 2008/0108255 A1 May 8, 2008

Related U.S. Application Data

(60) Provisional application No. 60/610,069, filed on Sep. 15, 2004.

(51) Int. Cl.
  *H01R 4/02* (2006.01)
(52) U.S. Cl. .................................. 439/876; 439/83
(58) Field of Classification Search ............. 439/83, 439/876; 29/843
See application file for complete search history.

(56) References Cited

U.S. PATENT DOCUMENTS

| 3,744,129 | A | | 7/1973 | Dewey, Jr. |
| 4,597,628 | A | | 7/1986 | Seidler |
| 4,712,721 | A | | 12/1987 | Noel et al. |
| 4,883,435 | A | | 11/1989 | Seidler |
| 5,344,343 | A | * | 9/1994 | Seidler ............. 439/876 |
| 5,441,430 | A | * | 8/1995 | Seidler ............. 439/876 |
| 5,471,368 | A | | 11/1995 | Downie et al. |
| 5,509,203 | A | | 4/1996 | Yamashita |
| 5,653,617 | A | * | 8/1997 | Seidler ............. 439/876 |
| 5,673,846 | A | | 10/1997 | Gruber |
| 5,688,150 | A | | 11/1997 | Seidler et al. |
| 5,709,574 | A | | 1/1998 | Bianca et al. |
| 6,261,136 | B1 | | 7/2001 | Dennis |
| 6,294,745 | B1 | | 9/2001 | Gruber |

(Continued)

FOREIGN PATENT DOCUMENTS

JP 09-055244 A 2/1997

(Continued)

*Primary Examiner*—Thanh-Tam T Le
(74) *Attorney, Agent, or Firm*—Stephen L. Sheldon

(57) ABSTRACT

A method of attaching a solder element to a contact and the contact assembly formed thereby. The contact assembly is used in a connector. The solder element is either staked or stapled to the contact. The solder element can take a variety of shapes and disclosed herein is a tear-drop shape, a "wolf's head" shape and a circular shape. An over-stress feature is also provided for when the contact assembly is mounted to a printed wiring board.

11 Claims, 14 Drawing Sheets

U.S. PATENT DOCUMENTS

| | | |
|---|---|---|
| 6,452,112 B1 | 9/2002 | Terashima et al. |
| 6,461,188 B2 | 10/2002 | Ruel |
| 6,494,754 B2 | 12/2002 | Cachina et al. |
| 6,534,726 B1 | 3/2003 | Okada et al. |
| 6,679,709 B2 * | 1/2004 | Takeuchi .................. 439/83 |
| 6,979,238 B1 * | 12/2005 | Mongold et al. ............ 439/874 |
| 7,043,830 B2 | 5/2006 | Farnworth |
| 7,189,083 B2 | 3/2007 | Seidler et al. |
| 2002/0029905 A1 | 3/2002 | Okada et al. |
| 2003/0013330 A1 | 1/2003 | Takeuchi |
| 2003/0102357 A1 | 6/2003 | Downes |
| 2004/0164124 A1 | 8/2004 | Lundstrom et al. |

FOREIGN PATENT DOCUMENTS

| | | |
|---|---|---|
| JP | 2003-157942 | 5/2003 |

* cited by examiner

FIG. 18
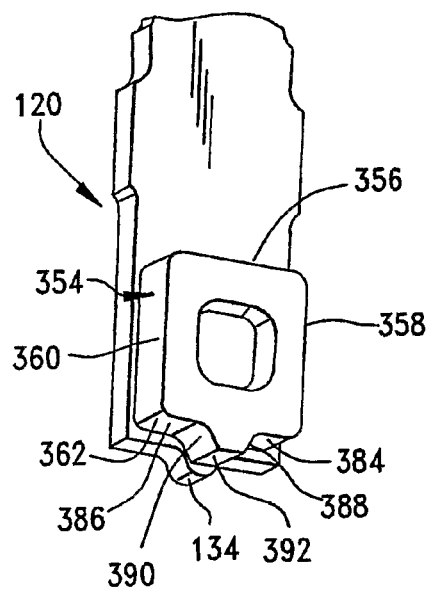
FIG. 20
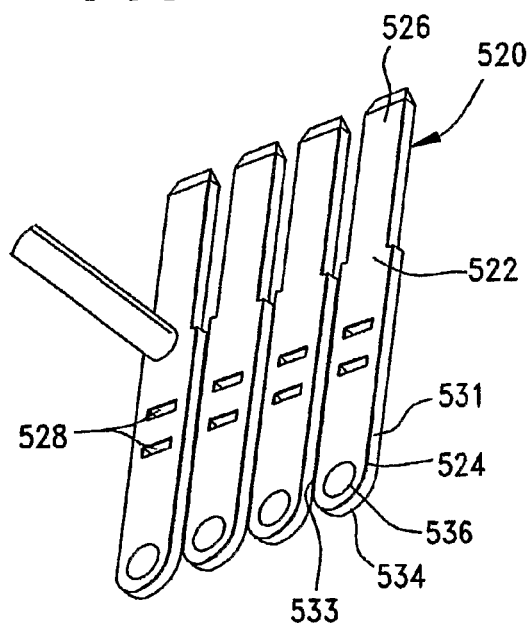
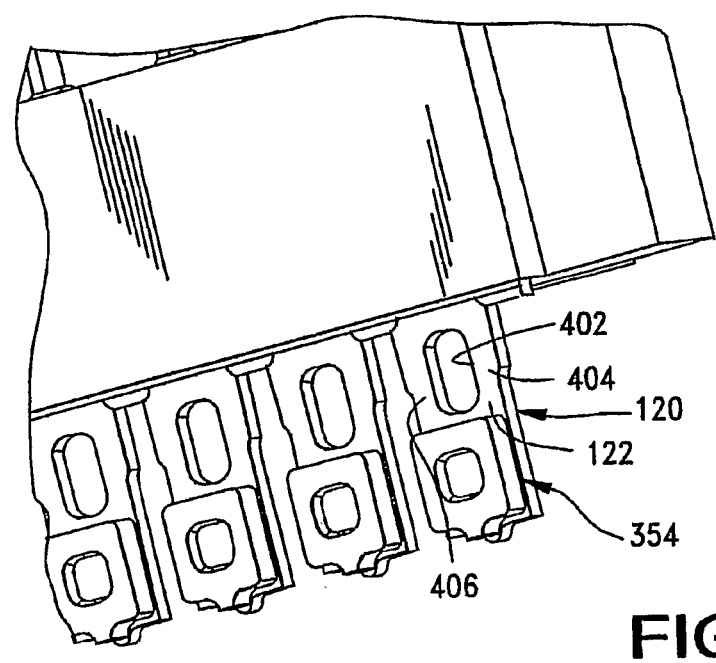
FIG. 19

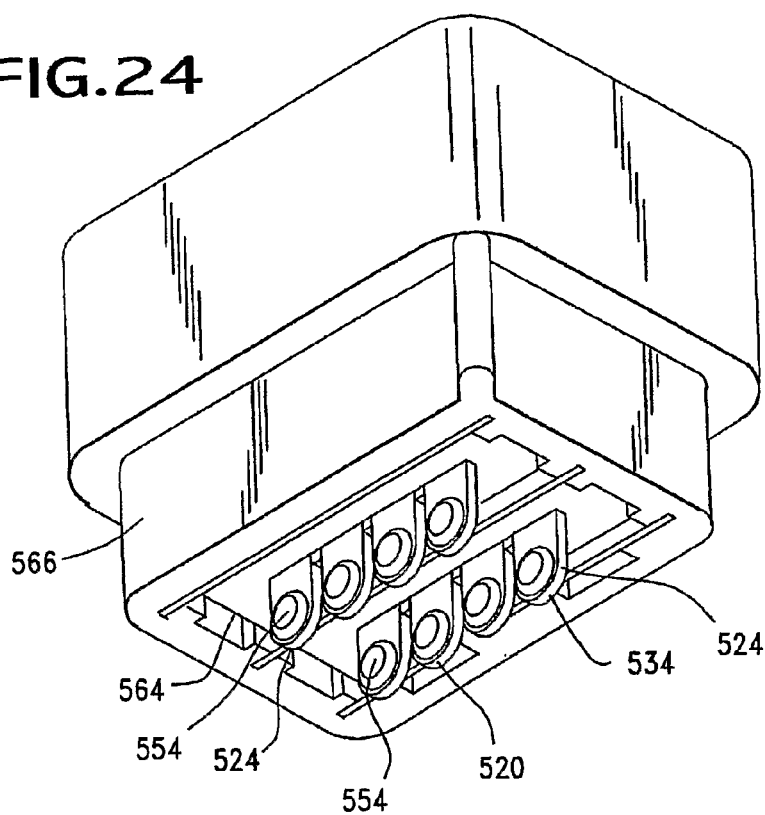
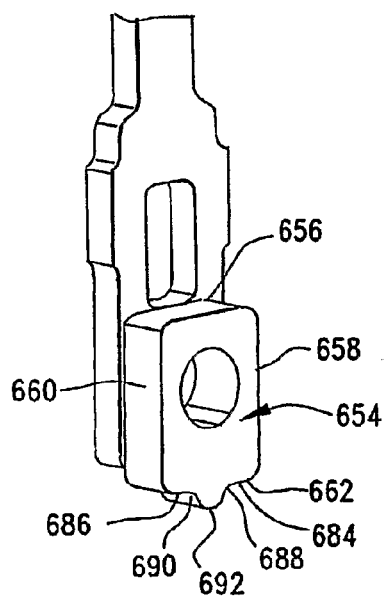
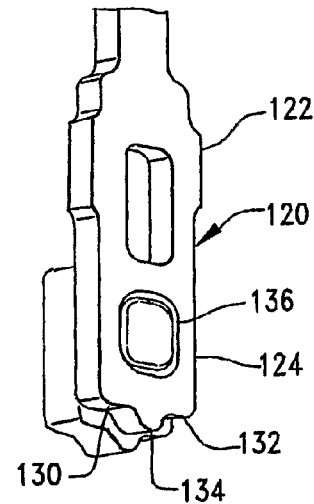

METHOD OF ATTACHING A SOLDER ELEMENT TO CONTACT AND THE CONTACT ASSEMBLY FORMED THEREBY

This application claims the benefit of U.S. provisional application Ser. No. 60/610,069, filed on Sep. 15, 2004 and herein incorporates same by reference.

BACKGROUND OF THE INVENTION

In prior art methods of assembling a ball grid array, a solder ball is fused to the end of a contact. The solder balls can be difficult to assemble with the contacts as they are loose. In addition, the assembly of the solder ball is fragile (balls may fall off). Furthermore, the co-planarity of the ball grid array with the conductive pads on the printed wiring board can be difficult to maintain because each ball sits on top of the solder paste on the conductive pad of the printed wiring board and the solder ball can interfere with the co-planarity of the contact field between the contact and the conductive pad. Additionally, when the solder ball is melted to form a solder joint between the contact and the conductive pad, a bulge may form. This bulge in the solder joint can cause shorts between adjacent contacts.

The present invention provides a contact assembly which overcomes these problems and which presents additional advantages will become apparent upon a reading of the attached disclosure in combination with a study of the drawings.

SUMMARY OF THE INVENTION

Briefly, the present invention discloses a method of attaching a solder element to a contact and the contact assembly formed thereby. The contact assembly is used in a connector. The solder element is either staked or stapled to the contact. The solder element can take a variety of shapes and disclosed herein is a tear-drop shape, a "wolf's head" shape and a circular shape. An over-stress feature is also provided for when the contact assembly is mounted to a printed wiring board.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 18 is a perspective view of a contact assembly formed in accordance with fourth preferred embodiment;

FIG. 19 is a perspective view of a plurality of contact assemblies formed in accordance with fifth preferred embodiment and mounted in a connector;

FIGS. 20 and 21 are perspective views illustrating steps for forming a contact assembly in accordance with a sixth preferred embodiment;

FIG. 22 is a perspective view of a contact assembly formed in accordance with the sixth preferred embodiment;

FIG. 24 is a perspective view of a plurality of contact assemblies formed in accordance with a seventh preferred embodiment and mounted in a connector assembly;

FIGS. 25 and 26 are perspective views of a contact assembly formed in accordance with the eighth preferred embodiment;

DETAILED DESCRIPTION OF THE ILLUSTRATED EMBODIMENTS

Figure 1:
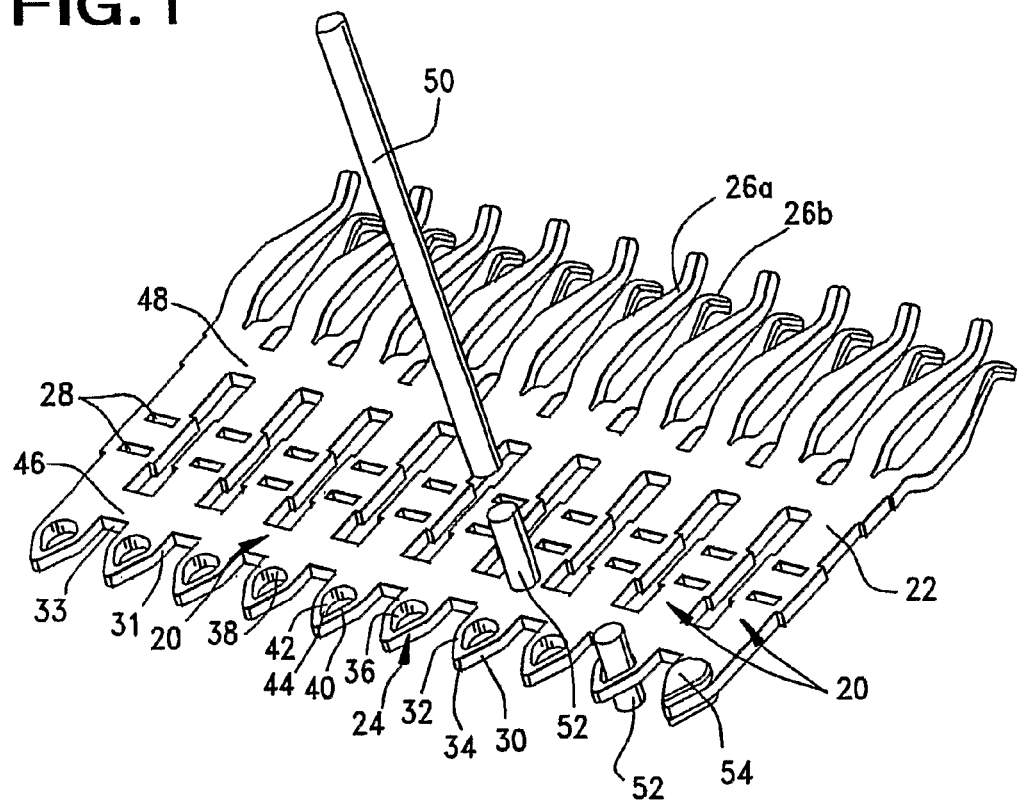
FIG. 1 is a perspective view illustrating a step for forming a first preferred embodiment of the contact assembly.
Figure 2:
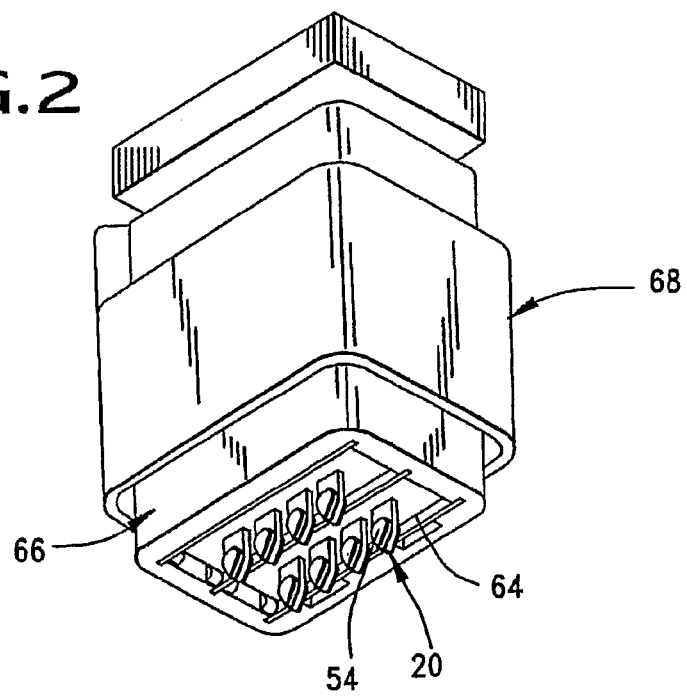
FIG. 2 is a perspective view of the contact assembly formed in accordance with a first preferred embodiment of FIG. 1, shown inserted into a connector assembly.
Figure 3:
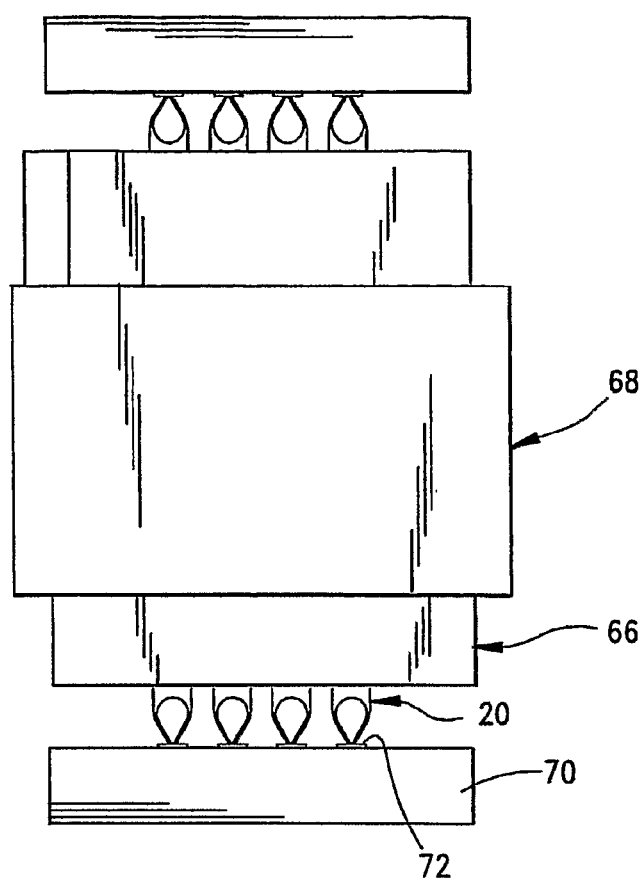
FIG. 3 is a side elevational view of the contact assembly of FIG. 1, shown inserted into a connector assembly and mated with a printed wiring board.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

Figure 30:
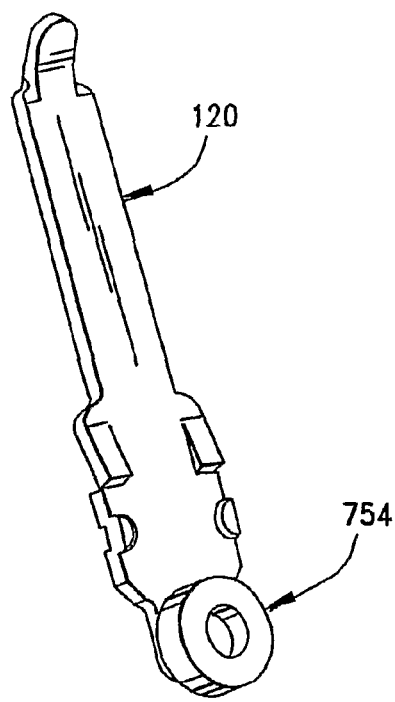
FIG. 30 is a perspective view of a contact assembly formed in accordance with a ninth preferred embodiment.
Figure 31:
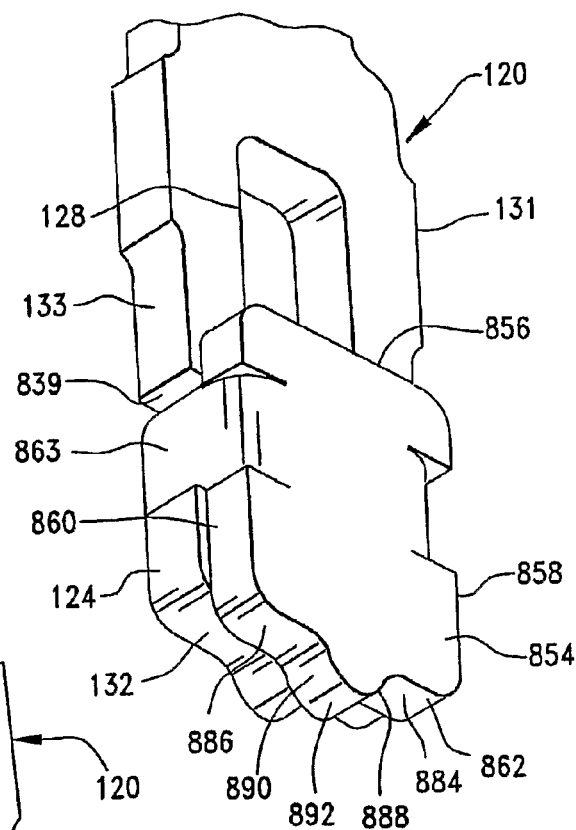
FIGS. 31 and 32 are perspective views of a contact assembly formed in accordance with a tenth preferred embodiment.
Figure 32:
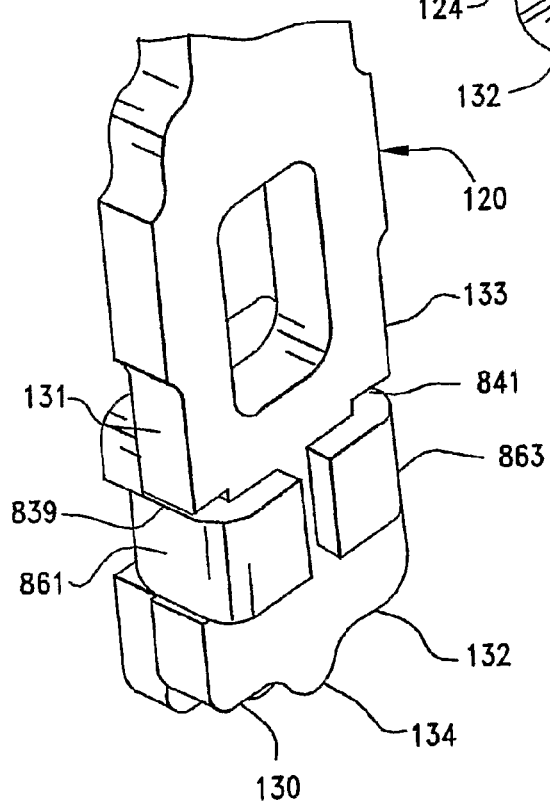

The present invention provides a method of attaching a solder mass to a conductive contact and the contact assembly formed thereby. A first embodiment is shown in FIGS. 1-6; a second embodiment is shown in FIGS. 7-13; a third embodiment is shown in FIGS. 14-17; a fourth embodiment is shown in FIG. 18; a fifth embodiment is shown in FIG. 19; a sixth embodiment is shown in FIGS. 20-23; a seventh embodiment is shown in FIG. 24; an eighth embodiment is shown in FIGS. 25-29; a ninth embodiment of the invention is shown in FIG. 30; and a tenth embodiment of the invention is shown in FIGS. 31 and 32.

Attention is now invited to the first embodiment of the invention shown in FIGS. 1-6.

Initially, a sheet of conductive material (not shown) is provided. A continuous strip of contacts 20 is formed out of the sheet material by conventional means, such as stamping and forming the contacts 20 out of the sheet. Each contact 20 includes generally rectangular body 22 having a tail 24 at first end thereof and a pair of mating contacts 26a, 26b at the second end thereof. The body 22 has a pair of apertures 28 therethrough for attachment of the respective contact 20 to a wafer. The tail 24 of each contact 20 is generally shaped like a "tear-drop". The tail 24 includes straight sides 31, 33 which are parallel to the sides of the body 22 and sides 30, 32 that extend therefrom and taper inwardly to a rounded point 34. An aperture 36 is provided through the tail 24. The aperture 36 is generally shaped like a "tear-drop" such that the base 38 of the aperture 36 is round and the sides 40, 42 of the aperture 36 taper inwardly to a rounded point 44. The rounded point 44 of the aperture 26 is generally axially aligned with the rounded point 34 on the tail 24 along the axis of the contact 20. The mating contacts 26a, 26b are conventional and allow for a mating contact (not shown) to be inserted therebetween. While a female contact 20 is shown in FIGS. 1-6, it is to be understood that a male contact can be formed in accordance with present invention by substituting an appropriate male mating contact. A first carrier member 46 is provided between adjacent contacts 20 in the strip at the first end of the body 22 and a second carrier member 48 is provided between adjacent contacts 20 in the strip at the second end of the body 22. The contacts 20 are formed of suitable materials, such as a copper alloy, or nickel selectively plated tin at the tail 24 and gold in the mating contacts 26a, 26b.

Thereafter, a continuous feed of solder wire 50, which may be formed from a tin alloy, is provided. As shown, the solder wire 50 has a round cross-section which has a dimension that is slightly smaller than the dimension of the base 38 of the aperture 36, however, it is to be understood that the solder wire 50 may be formed with other cross-sections. Next, the solder wire 50 is cut by suitable means into a predetermined length to form a solder element 52.

The solder element 52 is inserted into the aperture 36. As shown, the solder element 52 does not completely fill the aperture 36.

Figure 4:
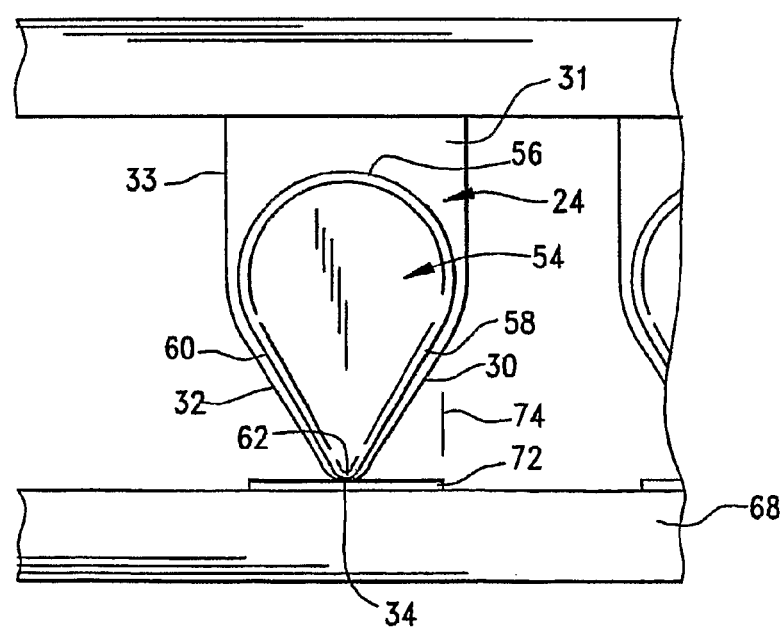
FIG. 4 is an enlarged side elevational view of a portion of the contact assembly of FIG. 1, shown inserted into a connector assembly and ready for mating with a printed wiring board.
Figure 5:
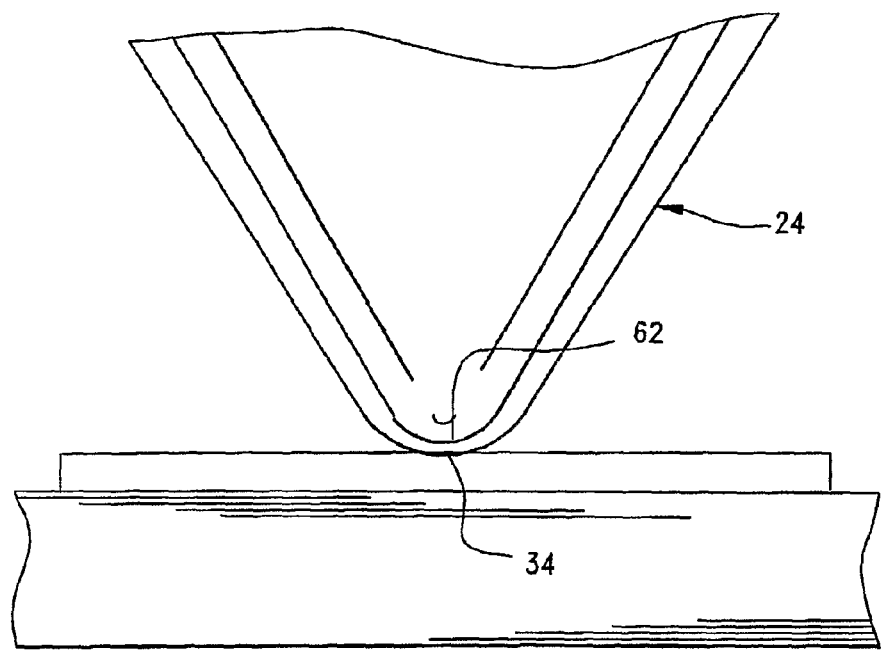
FIG. 5 is an even further enlarged side elevational view of a portion of the contact assembly of FIG. 1, shown inserted into a connector assembly and ready for mating with a printed wiring board.

Next, the solder element 52 is cold-formed by suitable means to mechanically secure the solder element 52 to the tail 24 of the contact 20 and thereby forming a solder mass 54 on the tail 24 of the contact 20 and completing the contact assembly. A heavier solder mass 54 can be provided versus prior art solder balls since the solder mass 54 is staked to the contact 20. As a result of the cold-forming, the solder element 52 is deformed into a "tear-drop" shaped solder mass 54 on the tail 24 of the contact 20. The "tear-drop" shaped solder mass 54 has a generally round base 56, with sides 58, 60 that taper inwardly to a rounded point 62. The rounded point 62 of the solder mass 54 is generally axially aligned with the rounded point 34 on the tail 24 of the contact 20 along the axis of the contact 20. As shown in FIGS. 4 and 5, the formed solder mass 54 is recessed from the edges of the tail 24 of the contact 20, such that a portion of the contact 20 is exposed around the entire solder mass 54. The solder mass 54 is assembled to the contact 20 in a controlled process as opposed to the prior art which uses loose balls.

Next, the strip of contacts 20 with the solder masses 54 attached thereto are inserted into the wafer 64. The carriers 46, 48 between the adjacent contacts 20 are then removed by suitable means such that individual contacts 20 are formed and held by the wafer 64. The wafer 64 having the contacts 20 mounted thereto are inserted into a connector assembly 66 for connection to a mating connector assembly 68 and to a printed wiring board 70. The tails 24 of the contacts 20 extend from the connector assembly 66 for mating with the printed wiring board 70.

These steps are preferably carried out in a continuous line assembly. The attachment of the solder element 52 to the contact 20 can be effected on one contact at a time, on a comb of contacts, or on a comb of contacts that have been assembled into a plastic molding.

The printed wiring board 70 is conventionally formed and includes conductive pads 72 for mating with the contacts 20. A solder paste deposit 74 is provided on each pad 72 in a conventional manner.

To mate each of the contacts 20 having the solder mass 54 thereon with the printed wiring board 70, the tail 24 is moved against the conductive pad 24 on the printed wiring board 70 and the solder mass 54 is at least partially immersed into the solder paste 74 as shown in FIG. 4. The rounded point 34 of the contact 20 acts as a penetrator into the solder paste 74 and engages against the conductive pad 72 when the contact 20 is fully engaged with the printed wiring board 70 (some solder paste may remain preventing the actual engagement of the tail 24 of the contact 20 and the pad 72).

The printed wiring board 70 may not be completely flat and may have variability in the co-planarity of the conductive pads 72. The engagement of the tail 24 of the contact 20 and the conductive pad 72 aids in minimizing soldering issues associated with a lack of co-planarity because the tail 24 penetrates into the solder paste deposit 74 and may have actual contact with the conductive pad 72, rather than sitting on top of the solder paste as occurs with solder balls. A co-planarity tolerance approximately equal to the thickness of the solder paste deposit 74 is thereby provided. The recess formed between the edges 58, 60, 62 of the solder mass 54 and the edges 30, 32, 34 of the tail 24 of the contact 20 prevents the solder mass 54 from interfering with the co-planarity of the contact field between the rounded point 34 and the conductive pad 72.

Figure 6:
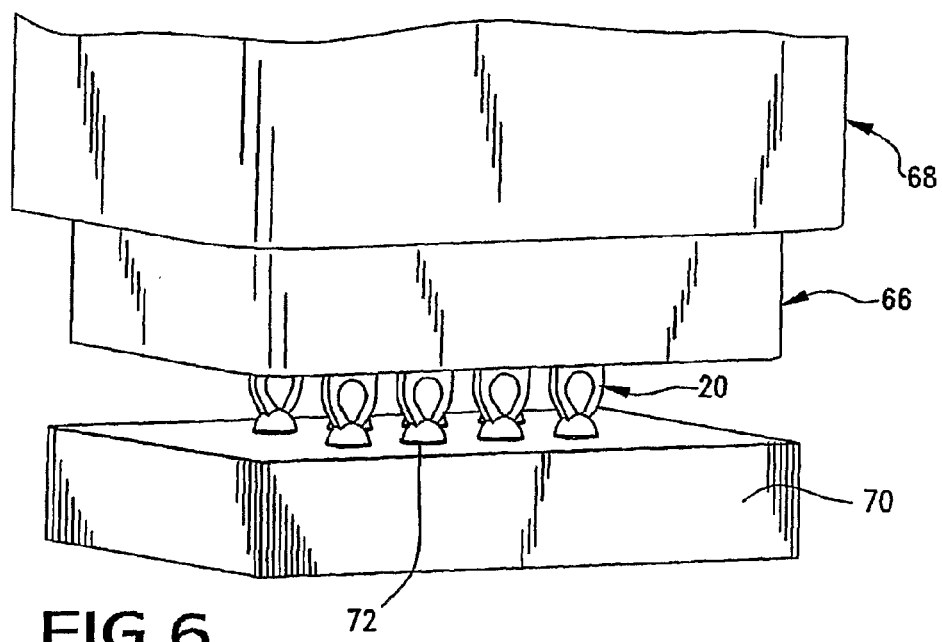
FIG. 6 is a perspective of the contact assembly of FIG. 1, shown inserted into a connector assembly and mated with a printed wiring board.
Figure 7:
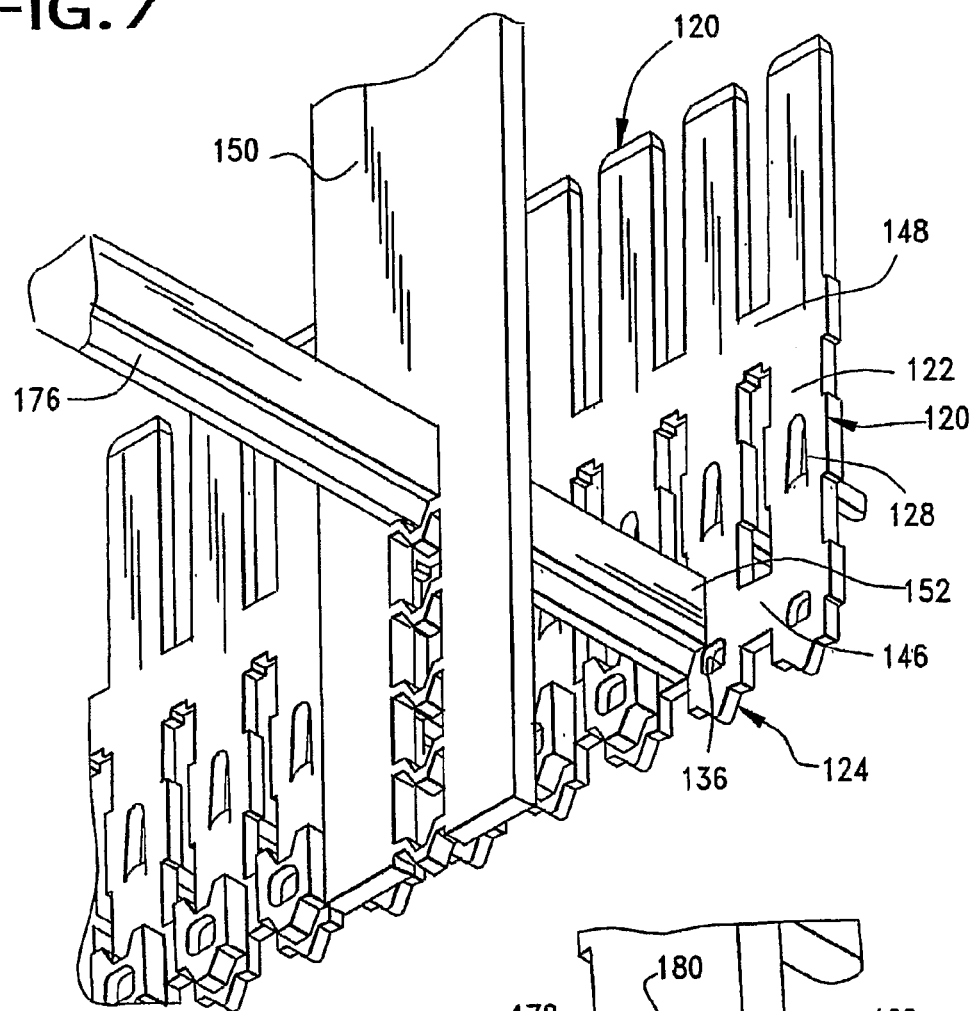
FIG. 7 is a perspective view illustrating a step for forming the contact assembly of FIG. 1.

Next, a reflow process permanently mates the solder paste 74 and the solder mass 54 together to form a solder joint as shown in FIG. 6. During the reflow process, the solder mass 54 at least partially melts and melds with the melted solder paste 74. Since the contact 20 is penetrated into the solder paste 74, movement between the contact 20 and the solder paste 74 is reduced during the reflow process. The at least partially melted solder mass 54 collects at the rounded point 34 at the first end of the contact 20. As a result, the solder joint does not form a bulge which can occur with a solder ball. The aperture 36 in the contact 20 provides an additional attachment point between the contact 20, the melted solder mass 54 and the solder paste 74 when the solder joint is formed.

Attention is now invited to the second embodiment of the invention shown in FIGS. 7-13.

Initially, a sheet of conductive material (not shown) is provided. A continuous strip of contacts 120 is formed out of the sheet material by conventional means, such as stamping the contacts 120 out of the sheet. Each contact 120 includes a generally rectangular body 122 having a tail 124 at first end thereof and a mating contact 126 at the second end thereof. While a male contact 120 is shown in the second embodiment, it is to be understood that a female contact can be formed by forming an appropriate female mating contact. The body 122 has an aperture 128 therethrough for attachment of the respective contact 120 to a wafer 164. The tail 124 of each contact 120 is generally shaped like a "wolf head". The tail 120 has straight side edges 131, 133 which are parallel to the side edges of the rectangular body 122. A bottom edge has generally flat end sections 130, 132 with a curved intermediate section 134 therebetween having sides 134a, 134b that taper towards each other to a rounded point 134c. The flat end sections 130, 132 are generally perpendicular to the side edges 131, 133. An aperture 136 is provided through the tail 124. The aperture 136 is generally a square with rounded corners. A chamfer 137 is provided on the edges of the one side of the aperture 136. A first carrier member 146 is provided between adjacent contacts 120 in the strip at the first end of the body 122 and a second carrier member 148 is provided between adjacent contacts 120 in the strip at the second end of the body 122. The contacts 120 are formed of suitable materials, such as a copper alloy, or nickel selectively plated with tin at the tail and gold in the mating contact.

Thereafter, a strip of solder material 150, which may be formed from a tin alloy, is provided. A blanking punch 176 and die are used to punch a predefined shape from the strip of solder material 150 thereby forming a solder element 152. The solder element 152 is generally shaped like a "wolf head". The solder element 152 has a top edge 156, side edges 158, 160 and a bottom edge 162. The top edge 156 has a generally V-shaped recess 178 therein with flat end sections 180, 182 on either side thereof. The side edges 158, 160 are straight and are generally perpendicular to the flat end sections 180, 182 on the top edge 156. The bottom edge 162 has generally flat end sections 184, 186 with an intermediate section therebetween. The flat end sections 184, 186 are generally perpendicular to the side edges 158, 160 and generally parallel to the end sections 180, 182. The intermediate section is formed from a first surface 188 and a second surface 190 which respectively taper towards each other from the end sections 184, 186 and a flat section 192 therebetween. The first and second surfaces 188, 190 and the intermediate section 192 form a point.

Next, the solder element 152 is placed against the tail 124 of the contact 120 to which it is to be attached on the side of the aperture without the chamfer 137. The point 188, 190, 192 of the solder element 152 is generally axially aligned with the point 134 on the tail 124 along the axis of the contact 120.

An extruding punch 194, which is located within the blanking punch 176, and die (not shown) are used to deform an inner portion 196 of the solder element 152 into the aperture 136 in the contact 120 such that a section 197 of the inner portion 196 is located in the chamfer 137 in the aperture 136.

Figure 8:
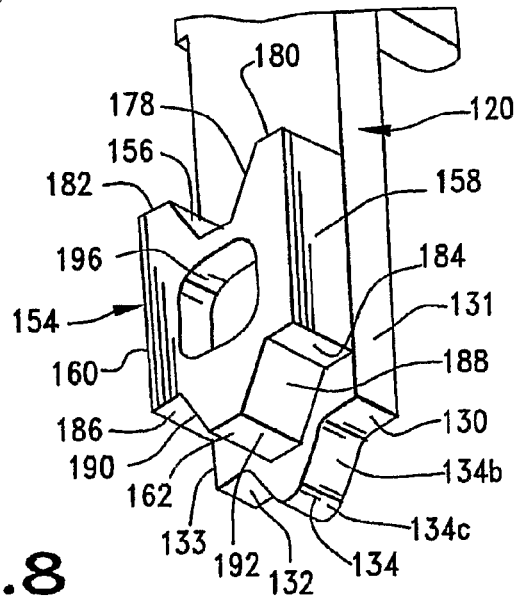
FIG. 8 is a perspective view of a portion of a contact assembly formed in accordance with a second preferred embodiment.
Figure 9:
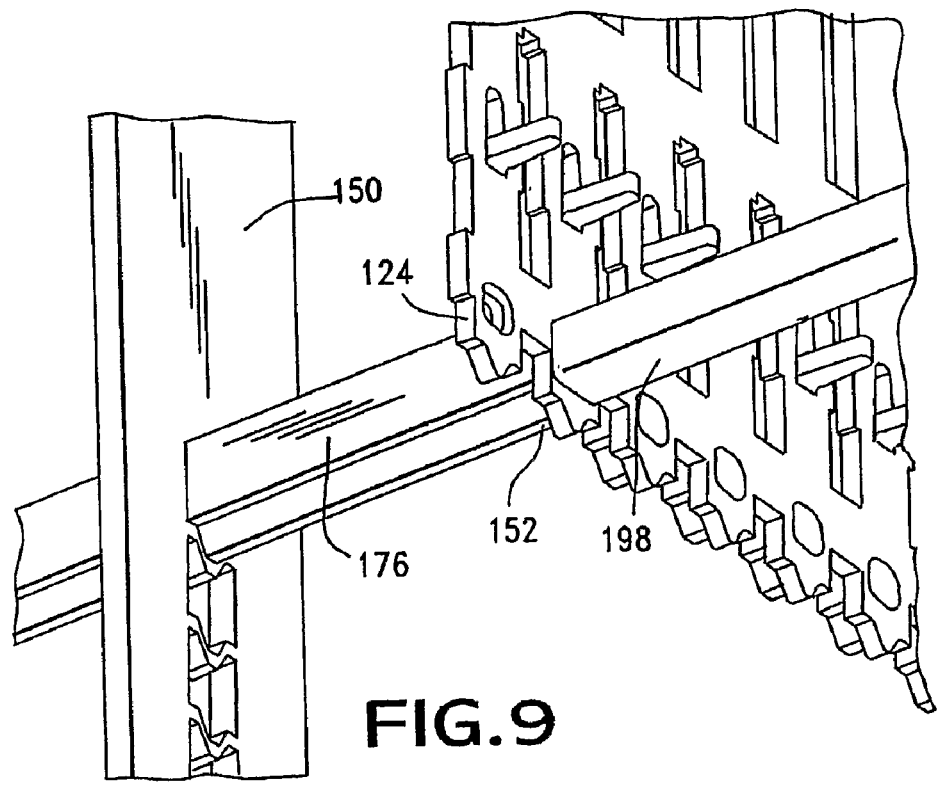
FIGS. 9 and 10 are perspective views illustrating steps for forming the contact assembly of FIG. 8.
Figure 10:
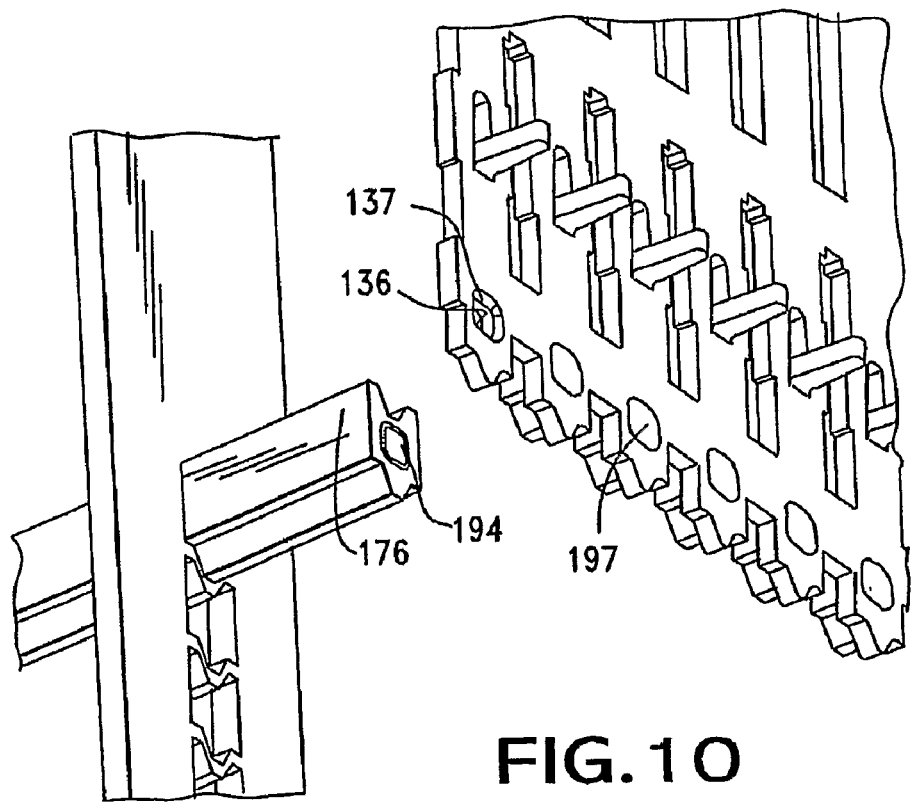
Figure 11:
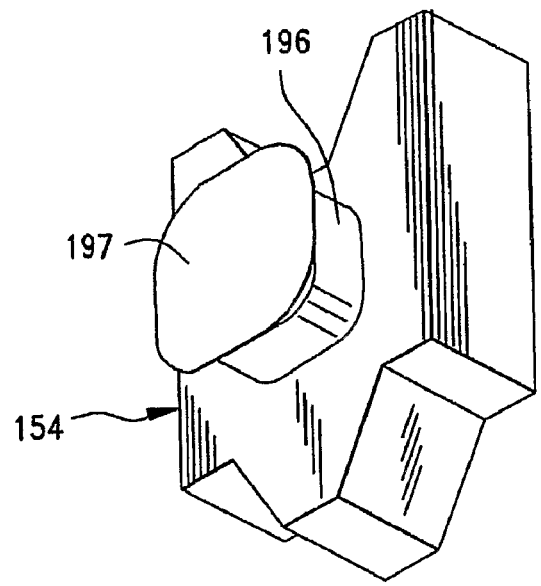
FIG. 11 is a perspective view of a portion of a contact assembly of FIG. 8.
Figure 12:
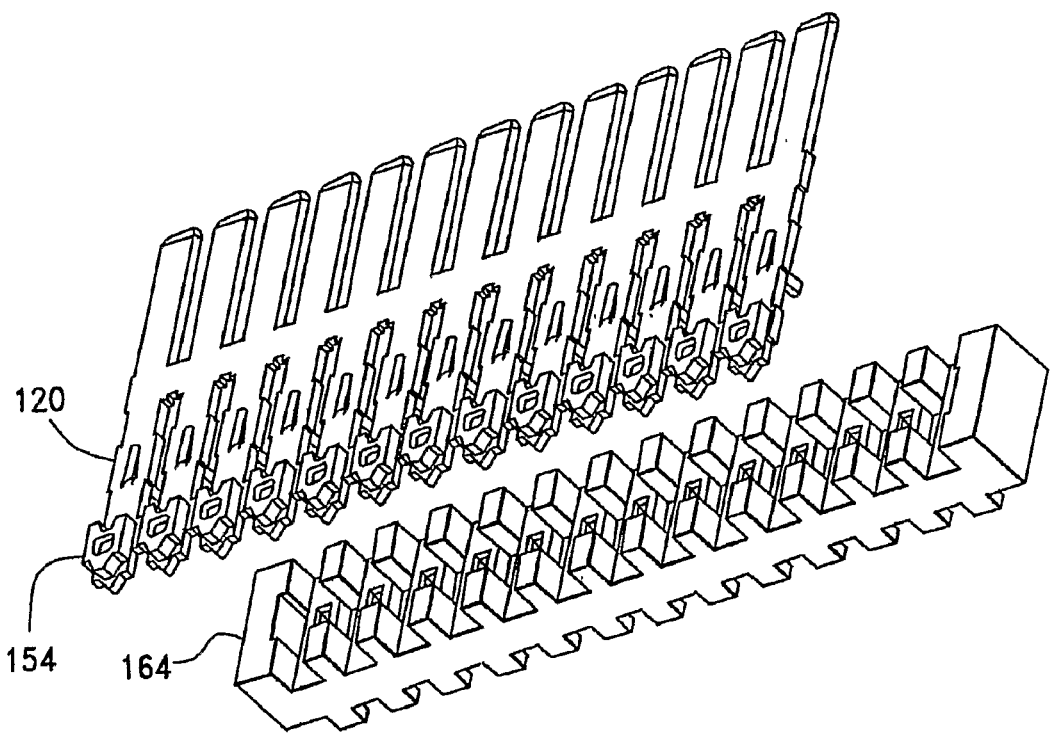
FIG. 12 is a perspective view illustrating a step for forming the contact assembly of FIG. 8.
Figure 13:
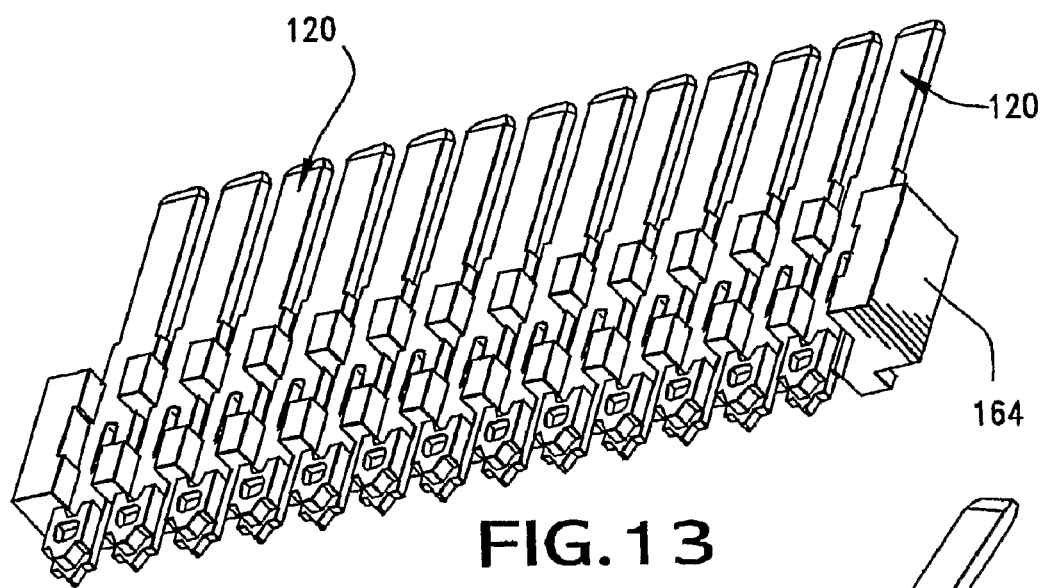
FIG. 13 is a perspective view of a plurality of the contact assemblies of FIG. 8 joined together in a wafer.
Figure 16:
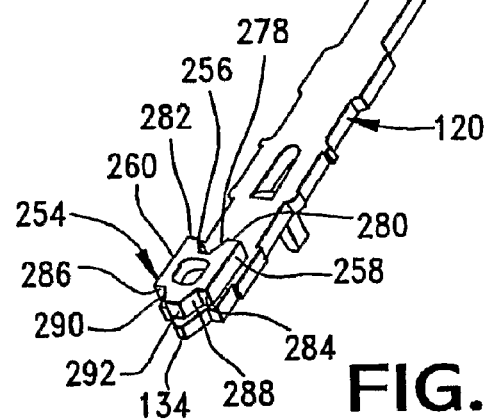
FIG. 16 is a perspective view of a contact assembly formed in accordance with the third preferred embodiment.
Figure 17:
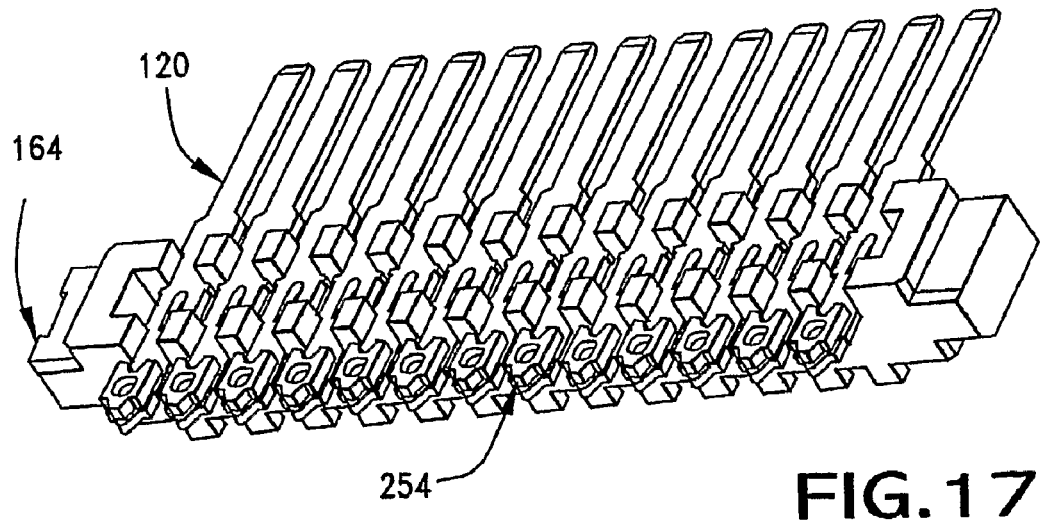
FIG. 17 is a perspective view illustrating a step for joining a plurality of contact assembly in accordance with a third preferred embodiment together.

A marriage punch 198 on the opposite side of the tail 124 is then engaged with the section 197 to form a bloom, thereby causing the section 197 to expand and fill the chamfer 137 and to mechanically secure the solder element 152 to the contact 120 and to complete the contact assembly. This forms a solder mass 154 on the tail 124 of the contact 120. A heavier solder mass 154 can be used versus prior art balls since the solder mass 154 is staked to the contact. FIG. 11 shows the solder mass 154 without the contact 120 therein. The bloom formed by the section 197 and the inner portion 196 can be clearly seen. As shown in FIG. 8, the edges 184, 186, 188, 190, 192 of the solder mass 154 are recessed from the edges 130, 132, 134 of the tail 124 of the contact 120, such that a portion of the contact 120 is exposed therebetween.

The solder mass 154 is assembled to the contact 120 in a controlled process as opposed to the prior art which uses loose balls.

Next, the strip of contacts 120 with the solder masses 154 provided thereon are inserted into the wafer 164. The carriers 146, 148 between the contacts 120 are then removed by suitable means such that individual contacts 120 are formed and held by the wafer 164. The wafer 164 and the contacts 120 are inserted into a connector assembly (not shown) for connection to a mating contact and to a printed wiring board (not shown). The tails 124 of the contacts 120 extend from the connector assembly for mating with the printed wiring board.

These steps are preferably carried out in a continuous line assembly. As shown, the strip of contacts 120 are moved along a first direction and the strip of solder material 150 is moved perpendicularly relative to the moving strip of contacts 120. In addition, the punches 176, 194, 198 and associated dies can be configured to form multiple solder masses at a time.

The printed wiring board is conventionally formed and includes conductive pads (not shown) for mating with the tails of the contacts. A solder paste deposit (not shown) is provided on each pad.

To mate each of the contacts 120 having the solder mass 154 thereon with the printed wiring board, the tail 124 of the contact 120 is moved against the conductive pad and the solder mass 154 is at least partially immersed into the solder paste. The rounded point 134 of the tail 124 acts as a penetrator into the solder paste and preferably engages against the conductive pad when the contact 120 is fully engaged with the printed wiring board (some solder paste may remain preventing the actual engagement of the tail of the contact and the pad).

The printed wiring board may not be completely flat and may have variability in the co-planarity of the conductive pads. The engagement of the tail 124 of the contact 120 and the conductive pad aids in minimizing soldering issues associated with a lack of co-planarity because the contact 120 penetrates into the solder paste deposit and may have actual contact with the conductive pad, rather than sitting on top of the solder paste as occurs with solder balls. A co-planarity tolerance approximately equal to the thickness of the solder paste deposit on the conductive pad is thereby provided. The recess formed between the solder mass 154 and the edges 130, 132, 134 of the contact 120 prevents the solder mass 154 from interfering with the co-planarity of the contact field between the rounded point 134 and the conductive pad.

Next, a reflow process permanently mates the solder paste and the solder mass 154. During the reflow process, the solder mass 154 at least partially melts and melds with the melted solder paste to form a solder joint. The flat end sections 184, 186 on the solder mass 154 are located close enough to the printed wiring board to promote easy soldering and allows additional solder to accumulate between the flat end sections 130, 132 and the solder paste to make the solder joint stronger. Since the contact 120 is penetrated into the solder paste, movement between the contact 120 and the solder paste is reduced during the reflow process. The at least partially melted solder mass 154 collects at the rounded point 134 at the first end of the contact 120.

Attention is now invited to the third embodiment of the invention shown in FIGS. 14-17. The contacts 120 used in the third embodiment are identical to the contacts 120 in the second embodiment and are formed in an identical manner. Therefore, the specifics of same are not repeated herein.

After the formation of the contacts 120, a strip of solder material 250, which may be formed from a tin alloy, is provided. An extruder and associated die 200 are used to form a plurality of spaced apart shanks 296 on one side of the strip of solder material 250. The shanks 296 are placed through corresponding apertures 136 in the contacts 120.

Thereafter, a blanking and marriage punch 176 and associated die are used to punch plurality of predefined shapes from the strip of solder material 250 around the shanks 296. The predefined shape is generally shaped like a "wolf head". The predefined shape has a top edge 256, side edges 258, 260 and a bottom edge 262. The top edge 256 has a generally V-shaped recess 278 therein with flat end sections 280, 282 on either side thereof. The side edges 258, 260 are straight and are generally perpendicular to the flat end sections 280, 282 on the top edge 256. The bottom edge 262 has generally flat end sections 284, 286 with an intermediate section therebetween. The flat end sections 284, 286 are generally perpendicular to the side edges 258, 260 and generally parallel to the end sections 280, 282. The intermediate section is formed from a first surface 288 and a second surface 290 which respectively taper towards each other from the end sections 284, 286 and a flat section 292 therebetween. The first and second surfaces 288, 290 and the intermediate section 292 form a point.

The attachment of one of the solder elements to its respective contact 120 is described, with the understanding that the other solder elements are connected to the respective contacts 120 in an identical manner and at the same time. The predefined shape is engaged against the tail 124 of the contact 120 by the blanking and marriage punch 176 to form a solder element. The point formed by the bottom edges 284, 286, 288, 290, 292 is generally axially aligned with the rounded point 132 on the tail 124 along the axis of the contact 120.

The blanking and marriage punch 176 is engaged with the shank 296 to form a bloom, thereby causing the shank 296 to expand and fill the chamfer 137 and to mechanically secure the solder element to the contact 120 and to complete the contact assembly. This forms a solder mass 254 on the tail 124 of the contact 120. A heavier solder mass 254 can be used versus prior art balls since the solder mass 254 is staked to the contact 120. The bottom edges 284, 286, 288, 290, 292 of the solder mass 254 are recessed from the bottom edges of the tail 124 of the contact 120, such that a portion of the contact 120 is exposed therebetween.

The solder mass 254 is assembled to the contact 120 in a controlled process as opposed to the prior art which uses loose balls.

Next, the strip of contacts 120 with the solder masses 254 provided thereon are inserted into the wafer 164. The carriers between the contacts 120 are then removed by suitable means such that individual contacts 120 are formed and held by the wafer 164. The wafer 164 and the contacts 120 are inserted into a connector assembly (not shown) for connection to a mating contact and to a printed wiring board (not shown). The tails 124 of the contacts 120 extend from the connector assembly for mating with the printed wiring board.

These steps are preferably carried out in a continuous line assembly. As shown, the strip of contacts 120 are moved along a first direction and the strip of solder material 250 is moved perpendicularly relative to the moving strip of contacts 120.

The printed wiring board is conventionally formed and includes conductive pads (not shown) for mating with the tails of the contacts. A solder paste deposit (not shown) is provided on each pad.

To mate each of the contacts 120 having the solder mass 254 thereon with the printed wiring board, the tail 124 of the contact 120 is moved against the conductive pad and the solder mass 254 is at least partially immersed into the solder paste. The rounded point 134 of the tail 124 acts as a penetrator into the solder paste and preferably engages against the conductive pad when the contact 120 is fully engaged with the printed wiring board (some solder paste may remain preventing the actual engagement of the tail of the contact and the pad).

The printed wiring board may not be completely flat and may have variability in the co-planarity of the conductive pads. The engagement of the tail 124 of the contact 120 and the conductive pad aids in minimizing soldering issues associated with a lack of co-planarity because the contact 120 penetrates into the solder paste deposit and may have actual contact with the conductive pad, rather than sitting on top of the solder paste as occurs with solder balls. A co-planarity tolerance approximately equal to the thickness of the solder paste deposit on the conductive pad is thereby provided. The recess formed between the solder mass 254 and the bottom edges of the contact 120 prevents the solder mass 254 from interfering with the co-planarity of the contact field between the rounded point 234 and the conductive pad.

Next, a reflow process permanently mates the solder paste and the solder mass 254. During the reflow process, the solder mass 254 at least partially melts and melds with the melted solder paste to form a solder joint. The flat end sections 284, 286 on the solder mass 254 are located close enough to the printed wiring board to promote easy soldering and allows additional solder to accumulate between the flat end sections of the contact 120 and the solder paste to make the solder joint stronger. Since the contact 120 is penetrated into the solder paste, movement between the contact 120 and the solder paste is reduced during the reflow process. The at least partially melted solder mass 254 collects at the rounded point 134 at the first end of the contact 120.

Attention is invited to the fourth embodiment of the invention shown in FIG. 18. The contacts 120 used in the fourth embodiment are identical to the contacts 120 in the second embodiment and are formed in an identical manner. Therefore, the specifics of same are not repeated herein.

The fourth embodiment differs from the second embodiment in that the predefined shape that is punched from the strip of solder material, which may be formed from a tin alloy, is shaped differently. The predefined shape has a top edge 356, side edges 358, 360 and a bottom edge 362. The top edge 356 is straight. The side edges 358, 360 are straight and are generally perpendicular to the straight top edge 356. Rounded corners join the top edge 356 and the respective side edges 358, 360 together. The bottom edge 362 has generally flat end sections 384, 386 with an intermediate section therebetween. The flat end sections 384, 386 are generally perpendicular to the side edges 358, 360 and generally parallel to the top edge 356. Rounded corners join the flat end sections 384, 386 and the respective side edges 358, 360 together. The intermediate section is formed from a first surface 388 and a second surface 390 which respectively taper towards each other from the end sections 384, 386 and a flat section 392 therebetween. The first and second surfaces 388, 390 and the intermediate section 392 form a point.

The flat end sections 384, 386 are closer to the flat section 392 on the point in the fourth embodiment, than the flat end sections 184, 186; 284, 286 are distanced from the flat section 192; 292 on the point in the second embodiment.

The predefined shape formed in this fourth embodiment is mated to the contact 120 in the same manner as described in the second embodiment to form a solder mass 354 and is joined to the printed wiring board as described with respect to the second embodiment.

During the reflow process, the solder mass 354 at least partially melts and melds with the melted solder paste to form a solder joint. The flat end sections 384, 386 on the solder mass 354 are located close enough to the printed wiring board to promote easy soldering and allows additional solder to accumulate between the flat end sections of the contact 120 and the solder paste to make the solder joint stronger. Because the flat end sections 384, 386 are close to the flat section 392 on the point, this promotes better capillary action of the molten solder to obtain a stronger solder joint. Since the contact 120 is penetrated into the solder paste, movement between the contact 120 and the solder paste is reduced during the reflow process. The at least partially melted solder mass 354 collects at the rounded point 134 at the first end of the contact 120.

Attention is invited to the fifth embodiment of the invention shown in FIG. 19. The solder mass 354 shown in this fifth embodiment is the same as that shown in the fourth embodiment.

The contact 120 used in the fifth embodiment is substantially identical to the contact 120 in the second embodiment, and therefore only the differences are described herein. Otherwise, like reference numerals are used for like elements.

The body 122 includes an aperture 402 provided therethrough between the tail 124 and the aperture for attachment of the contact 120 to a wafer. The aperture 402 is oval and has its longer dimension directed along the long axis of the contact 120. As a result, two narrow beams 404, 406 are formed on the sides of the aperture 402. The aperture 402 and beams 404, 406 are formed out of the sheet material by conventional means, such as stamping the contacts 120 out of the sheet.

The provision of the aperture 402 and beams 404, 406 improves the fatigue strength of the resulting solder joint. Because of the temperature cycling that occurs during use, the printed wiring board and the connector assembly to which the contacts 120 are connected expand at different rates. As a result, the contacts 120 rotate relative to the solder joint. Upon sufficient or repeated rotations, the solder joint can break. The provision of the aperture 302 and beams 404, 406 provide a significant reduction in rotation of the portion of the contact 120 that is embedded into the solder paste. As a cantilever beam bends, its free end also rotates; this is a consequence of the shape of the deformed cantilever beam, which is a parabola. The oval aperture 402 limits the bending in the portion of the contact 120 that is left whole, thereby reducing the rotation, and significantly reducing the wrenching action to which the solder paste would otherwise be subjected. As a result, less force is transmitted to a portion of the contact 120 that is embedded into the solder paste and the fatigue strength is increased.

Attention is now invited to the sixth embodiment of the invention shown in FIGS. 20-23.

Figures 21, 22:
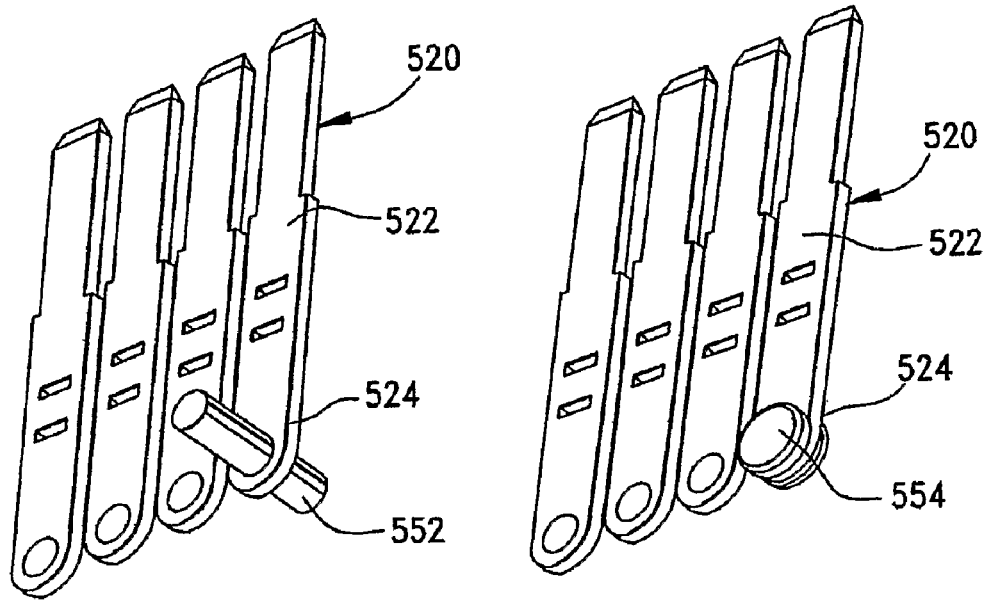

Initially, a sheet of conductive material (not shown) is provided. A continuous strip of contacts 520 is formed out of the sheet material by conventional means, such as stamping and forming the contacts 520 out of the sheet. Each contact 520 includes generally rectangular body 522 having a tail 524 at first end thereof and a mating contact 526 at the second end thereof. The body 522 has a pair of apertures 528 therethrough for attachment of the respective contact 520 to a wafer. The tail 524 of each contact 520 is generally rounded. The tail 524 includes straight sides 531, 533 which are parallel to the sides of the body 522 and a rounded end 534. An aperture 536 is provided through the tail 524. The aperture 536 is generally round, but other shapes may be provided. The mating contact 526 is conventional and allow for a mating contact (not shown) to be inserted therebetween. While a male contact 520 is shown in FIGS. 20-22, it is to be understood that a female contact can be formed in accordance with present invention by substituting an appropriate female mating contact. Carrier members (not shown), like that provided in the other embodiments, are provided between adjacent contacts 520 in the strip at the first end of the body 522 and at the second end of the body 522. The contacts 520 are formed of suitable materials, such as a copper alloy, or nickel selectively plated tin at the tail 524 and gold in the mating contact 526.

Thereafter, a continuous feed of solder wire (not shown), which may be formed from a tin alloy, is provided. The solder wire has a round cross-section which has a dimension that is slightly smaller than the dimension of the aperture 536, however, it is to be understood that the solder wire may be formed with other cross-sections. Next, the solder wire is cut by suitable means into a predetermined length to form a solder element 552. The solder element 552 is then inserted into the aperture 536.

Figure 23:
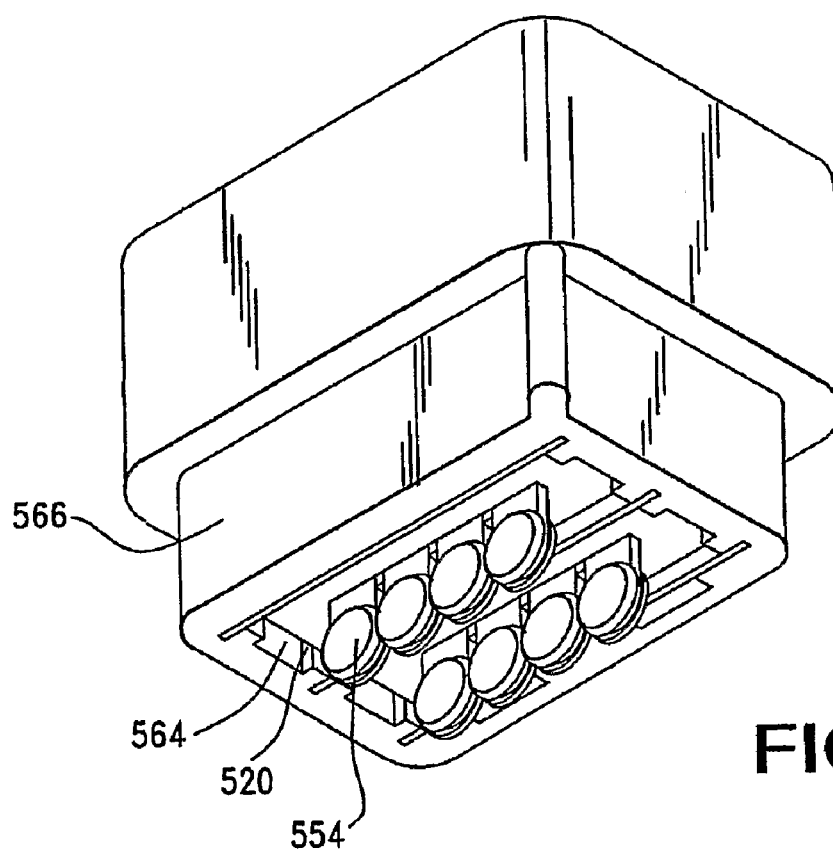
FIG. 23 is a perspective view of a plurality of contact assemblies formed in accordance with the sixth preferred embodiment and mounted in a connector assembly.
Figure 27:
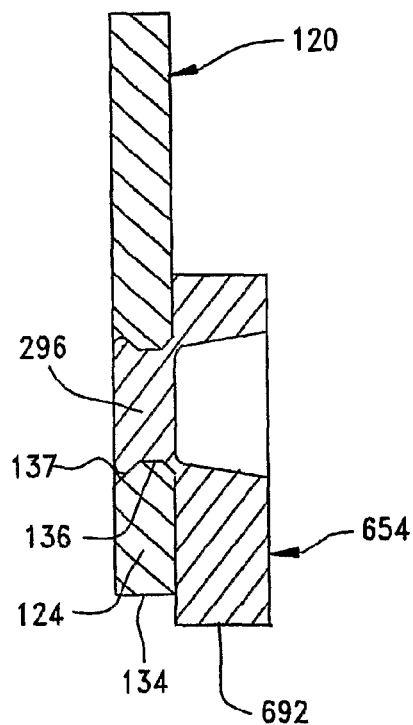
FIG. 27 is a cross-sectional view of the contact assembly of FIGS. 25 and 26.
Figure 28:
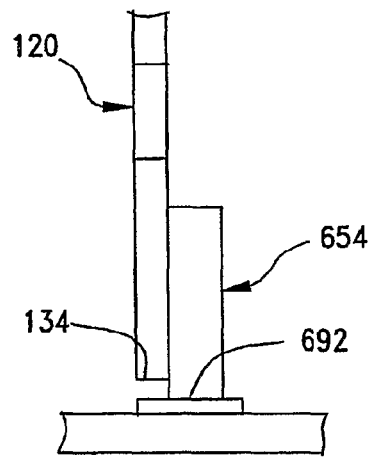
FIGS. 28 and 29 are side elevational views of the contact assembly being shown during mounting to a printed wiring board.
Figure 29:
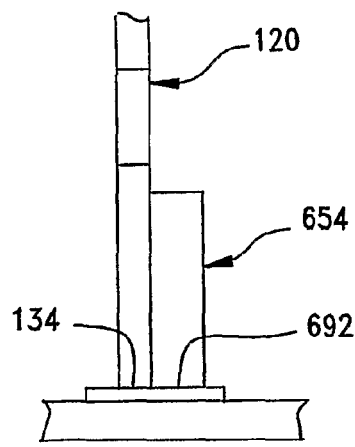

Next, the solder element 552 is cold-formed by suitable means to mechanically secure the solder element 552 to the tail 524 of the contact 520 and thereby forming a solder mass 554 on the tail 524 of the contact 520 and to complete the contact assembly. A heavier solder mass 554 can be provided versus prior art solder balls since the solder mass 554 is staked to the contact 520. As a result of the cold-forming, the solder element 552 is deformed into a circular shaped solder mass 554 on the tail 524 of the contact 520. As shown in FIGS. 22 and 23, the formed solder mass 554 overlaps the edges of the tail 524 of the contact 520, such that a portion of the contact 520 is not exposed around the entire solder mass 554. This is effected by providing a length of solder wire which is sufficiently long enough, such that sufficient material is provided, to form a bloom that overlaps the edges of the tail 524 of the contact 520. The solder mass 554 is assembled to the contact 520 in a controlled process as opposed to the prior art which uses loose balls.

Next, the strip of contacts 520 with the solder masses 554 attached thereto are inserted into the wafer 564. The carriers between the adjacent contacts 520 are then removed by suitable means such that individual contacts 520 are formed and held by the wafer 564. The wafer 564 having the contacts 520 mounted thereto are inserted into a connector assembly 566 for connection to a mating connector assembly (not shown) and to a printed wiring board (not shown). The tails 524 of the contacts 520 extend from the connector assembly 566 for mating with the printed wiring board.

These steps are preferably carried out in a continuous line assembly. The attachment of the solder element 552 to the contact 520 can be effected on one contact at a time, on a comb of contacts, or on a comb of contacts that have been assembled into a plastic molding.

The printed wiring board is conventionally formed and includes conductive pads for mating with the contacts 520. A solder paste deposit is provided on each pad in a conventional manner.

To mate each of the contacts 520 having the solder mass 554 thereon with the printed wiring board, the tail 524 is moved toward the conductive pad on the printed wiring board and the solder mass 554 is at least partially immersed into the solder paste. The rounded end of the solder mass 554 acts as a penetrator into the solder paste and engages against the conductive pad when the contact 520 is fully engaged with the printed wiring board (some solder paste may remain preventing the actual engagement of the solder mass 554 and the pad).

The printed wiring board may not be completely flat and may have variability in the co-planarity of the conductive pads. The engagement of the solder mass 554 and the conductive pad aids in minimizing soldering issues associated with a lack of co-planarity because the tail 524 penetrates into the solder paste deposit and the solder mass 554 may have actual contact with the conductive pad, rather than sitting on top of the solder paste as occurs with solder balls. A co-planarity tolerance approximately equal to the thickness of the solder paste deposit is thereby provided.

Next, a reflow process permanently mates the solder paste and the solder mass 554 together to form a solder joint. During the reflow process, the solder mass 554 at least partially melts and melds with the melted solder paste. Since the contact 520 is penetrated into the solder paste, movement between the contact 520 and the solder paste is reduced during the reflow process. The at least partially melted solder mass 554 collects at the rounded point 534 at the first end of the contact 520. As a result, the solder joint does not form a bulge which can occur with a solder ball.

FIG. 24 illustrates an alternative to the sixth embodiment and forms a seventh embodiment. The contact 520 is identically formed to the contact 520 in the sixth embodiment and like elements are denoted with like reference numerals.

After formation of the contact 520, a continuous feed of solder wire (not shown), which may be formed from a tin alloy, is provided. The solder wire has a round cross-section which has a dimension that is slightly smaller than the dimension of the aperture in the contact 520, however, it is to be understood that the solder wire may be formed with other cross-sections. Next, the solder wire is cut by suitable means into a predetermined length to form a solder element (not shown), like that shown in FIG. 21, but with a shorter predetermined length to the solder element 552 of the sixth embodiment. The solder element is then inserted into the aperture in the contact 520.

Next, the solder element is cold-formed by suitable means to mechanically secure the solder element to the tail 524 of the contact 520 and thereby forming a solder mass 554' on the tail 524 of the contact 520 and to complete the contact assembly. A heavier solder mass 554' can be provided versus prior art solder balls since the solder mass 554' is staked to the contact 520. As a result of the cold-forming, the solder element is deformed into a circular shaped solder mass 554' on the tail 524 of the contact 520. As shown in FIG. 24, the formed solder mass 554' is recessed from the edges of the tail 524 of the contact 520, such that a portion of the contact 520 is exposed around the entire solder mass 554'. The solder mass 554' is assembled to the contact 520 in a controlled process as opposed to the prior art which uses loose balls.

Next, the strip of contacts 520 with the solder masses 554' attached thereto are inserted into the wafer 564. The carriers between the adjacent contacts 520 are then removed by suitable means such that individual contacts 520 are formed and held by the wafer 564. The wafer 564 having the contacts 520 mounted thereto are inserted into a connector assembly 566 for connection to a mating connector assembly (not shown) and to a printed wiring board (not shown). The tails 524 of the contacts 520 extend from the connector assembly 566 for mating with the printed wiring board.

These steps are preferably carried out in a continuous line assembly. The attachment of the solder element to the contact 520 can be effected on one contact at a time, on a comb of contacts, or on a comb of contacts that have been assembled into a plastic molding.

The printed wiring board is conventionally formed and includes conductive pads for mating with the contacts 520. A solder paste deposit is provided on each pad in a conventional manner.

To mate each of the contacts 520 having the solder mass 554' thereon with the printed wiring board, the tail 524 is moved toward the conductive pad on the printed wiring board and the solder mass 554' is at least partially immersed into the solder paste. The rounded end of the tail 524 acts as a penetrator into the solder paste and engages against the conductive pad when the contact 520 is fully engaged with the printed wiring board (some solder paste may remain preventing the actual engagement of the tail 524 of the contact 520 and the pad).

The printed wiring board may not be completely flat and may have variability in the co-planarity of the conductive pads. The engagement of the tail 524 of the contact 520 and the conductive pad aids in minimizing soldering issues associated with a lack of co-planarity because the contact 520 penetrates into the solder paste deposit and may have actual contact with the conductive pad, rather than sitting on top of the solder paste as occurs with solder balls. A co-planarity tolerance approximately equal to the thickness of the solder paste deposit on the conductive pad is thereby provided. The recess formed between the solder mass 554' and the edges of the tail 524 of the contact 520 prevents the solder mass 554' from interfering with the co-planarity of the contact field between the rounded end 534 and the conductive pad.

Next, a reflow process permanently mates the solder paste and the solder mass 554' together to form a solder joint. During the reflow process, the solder mass 554' at least partially melts and melds with the melted solder paste. Since the contact 520 is penetrated into the solder paste, movement between the contact 520 and the solder paste is reduced during the reflow process. The at least partially melted solder mass 554 collects at the rounded end 534 at the first end of the contact 520. As a result, the solder joint does not form a bulge which can occur with a solder ball.

Attention is now invited to the eighth embodiment of the invention shown in FIGS. 25-29. The contacts 120 used in this eighth embodiment are identical to the contacts 120 in the second embodiment and are formed in an identical manner. Therefore, the specifics of same are not repeated herein.

The solder mass 654 of this eighth embodiment is formed in a similar manner to that of the third embodiment shown in FIGS. 14-17, except that the solder mass 654 includes an over-stress protection feature as discussed herein.

After the formation of the contacts 120, a strip of solder material, which may be formed from a tin alloy, is provided. In an identical manner to that described in relation to FIGS. 14 and 15, an extruder and associated die are used to form a plurality of spaced apart shanks on one side of the strip of solder material. Each shank 296 is placed through a corresponding aperture 136 in the respective contact 120.

Figure 14:
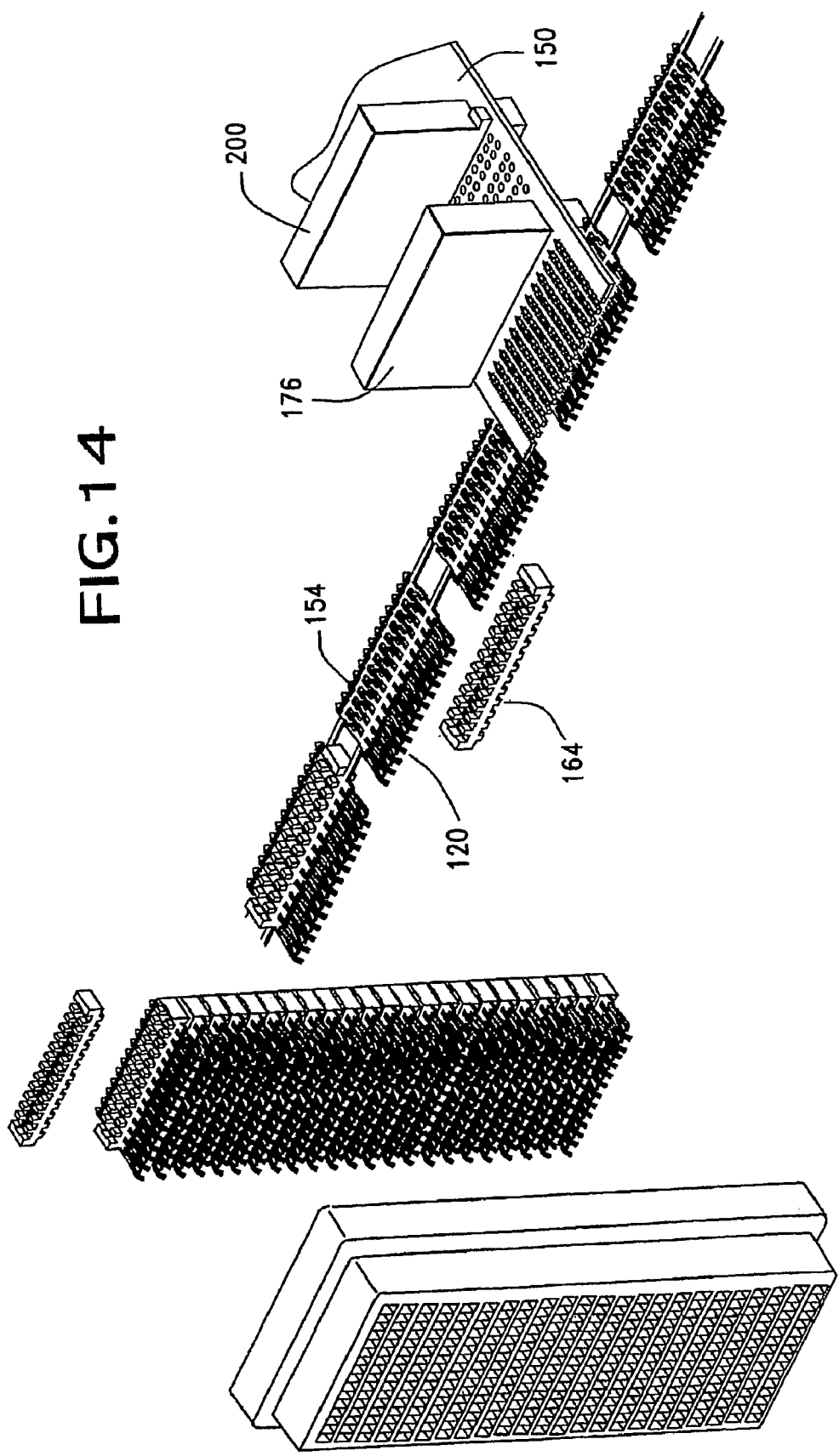
FIGS. 14 and 15 are perspective views illustrating steps for forming a contact assembly in accordance with a third preferred embodiment and for joining a plurality of the contact assemblies together.
Figure 15:
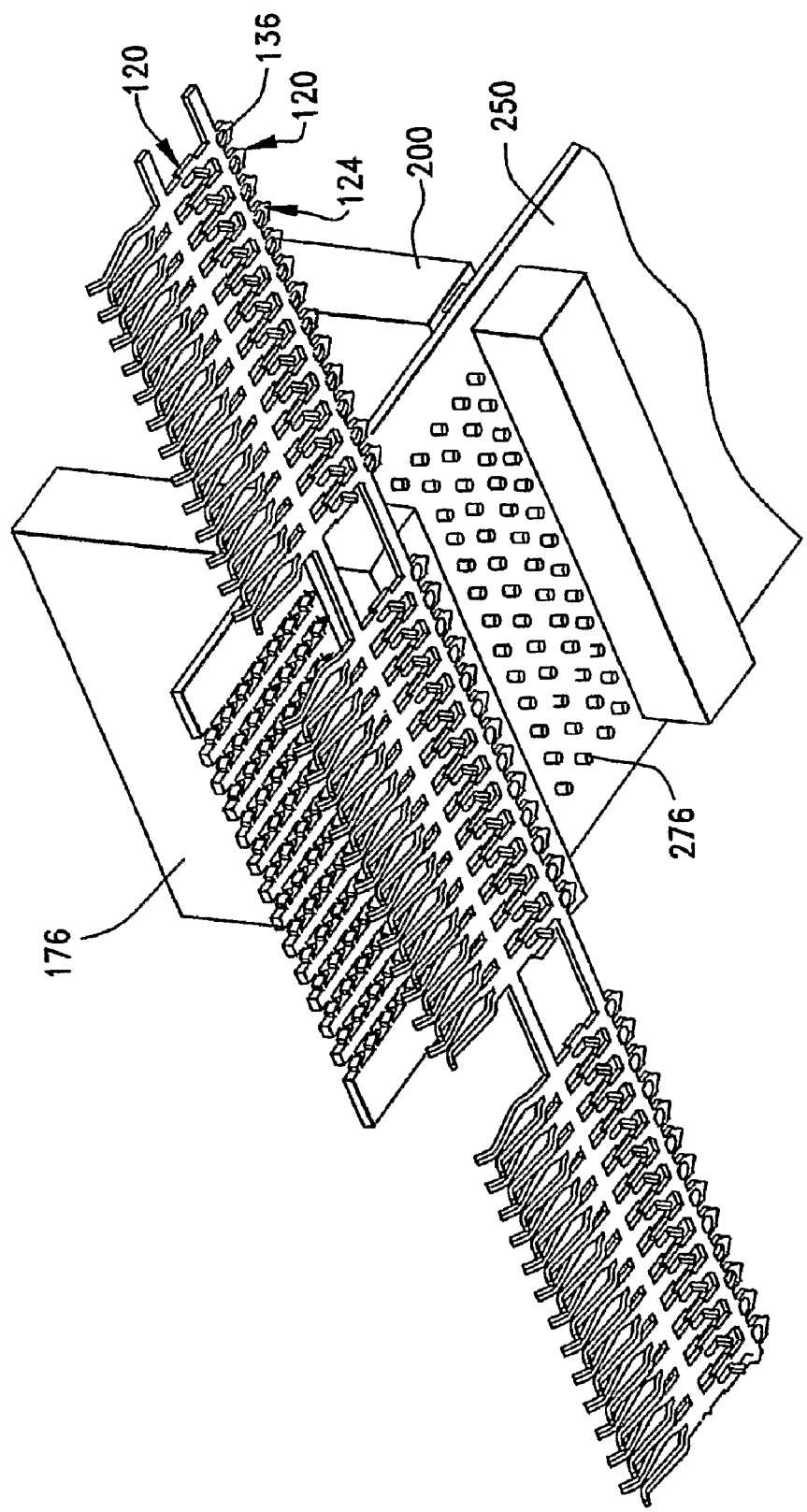

Thereafter, in an identical manner to that described in relation to FIGS. 14 and 15, a blanking and marriage punch and associated die are used to punch plurality of predefined shapes from the strip of solder material around the respective shanks 296. As best shown in FIG. 25, the predefined shape has a top edge 656, side edges 658, 660 and a bottom edge 662. The top edge 656 is straight. The side edges 658, 660 are straight and are generally perpendicular to the straight top edge 656. Rounded corners join the top edge 656 and the respective side edges 658, 660 together. The bottom edge 662 has generally flat end sections 684, 686 with an intermediate section therebetween. The flat end sections 684, 686 are generally perpendicular to the side edges 658, 660 and generally parallel to the top edge 656. Rounded corners join the flat end sections 684, 686 and the respective side edges 658, 660 together. The intermediate section is formed from a first surface 688 and a second surface 690 which respectively taper towards each other from the end sections 684, 686 and a rounded tip 692 therebetween. The first and second surfaces 688, 690 and the intermediate section 692 form a point. As a result, the predefined shape is identical to that of the third embodiment, with the exception that a rounded tip 692 is provided instead of a flat section 392. The flat end sections 684, 686 are closer to the rounded tip 692, than the flat end sections 184, 186; 284, 286 are distanced from the flat section 192; 292 on the point in the third embodiment.

The attachment of one of the solder elements to its respective contact 120 is described, with the understanding that the other solder elements are connected to the respective contacts 120 in an identical manner and at the same time. The predefined shape is engaged against the tail 124 of the contact 120 by the blanking and marriage punch to form a solder element. The point formed by the bottom edges 684, 686, 688, 690, 692 extends beyond the bottom edge defined by the generally flat end sections 130, 132 and the curved intermediate section 134 of the tail 124 along the axis of the contact 120. The sides of the solder element align with the sides of the tail 124.

In an identical manner to that described in relation to FIGS. 14 and 15, the blanking and marriage punch is engaged with the shank 296 to form a bloom, thereby causing the shank 296 to expand and fill the chamfer 137 and to mechanically secure the solder element to the contact 120 and to complete the contact assembly. This forms a solder mass 654 on the tail 124 of the contact 120. A heavier solder mass 654 can be used versus prior art balls since the solder mass 654 is staked to the contact 120. The bottom edges 684, 686, 688, 690, 692 of the solder mass 654 overlap the bottom edges of the tail 124 of the contact 120.

The solder mass 654 is assembled to the contact 120 in a controlled process as opposed to the prior art which uses loose balls.

Next, the strip of contacts 120 with the solder masses 654 provided thereon are inserted into the wafer (not shown). The carriers (not shown) between the contacts 120 are then removed by suitable means such that individual contacts 120 are formed and held by the wafer. The wafer and the contacts 120 are inserted into a connector assembly (not shown) for connection to a mating contact and to a printed wiring board (not shown). The tails 124 of the contacts 120 extend from the connector assembly for mating with the printed wiring board.

These steps are preferably carried out in a continuous line assembly. A strip of contacts 120 are moved along a first direction and the strip of solder material is moved perpendicularly relative to the moving strip of contacts 120.

The printed wiring board is conventionally formed and includes conductive pads (not shown) for mating with the tails of the contacts. A solder paste deposit (not shown) is provided on each pad.

To mate each of the contacts 120 having the solder mass 654 thereon with the printed wiring board, end of the solder mass 654 is moved against the conductive pad and the solder mass 654 is at least partially immersed into the solder paste. The rounded point 629 of the solder mass 654 acts as a penetrator into the solder paste and preferably engages against the conductive pad when the contact 120 is fully engaged with the printed wiring board (some solder paste may remain preventing the actual engagement of the solder mass 654 and the pad). Upon engagement of the solder mass 654 with the conductive pad, the connection point between the shank 296 and the solder mass 654 may shear, for example the connection point may have a 3.0 to 4.0 Newtons shear strength. Upon shearing, the solder mass 654 moves along the tail 124 until the rounded tip 692 of the solder mass 654 is aligned with the curved intermediate section 134 of the contact 120. The solder mass 654 remains abutting against the tail 124. This provides for better compliance with the printed wiring board.

The printed wiring board may not be completely flat and may have variability in the co-planarity of the conductive pads. The engagement of the tail 124 of the contact 120 and the conductive pad aids in minimizing soldering issues associated with a lack of co-planarity because the contact 120 penetrates into the solder paste deposit and will have actual contact with the conductive pad when the solder mass 654 shears, rather than sitting on top of the solder paste as occurs with solder balls. A co-planarity tolerance approximately equal to the thickness of the solder paste deposit on the conductive pad is thereby provided.

Next, a reflow process permanently mates the solder paste and the solder mass 654 and contact 120. During the reflow process, the solder mass 654 at least partially melts and melds with the melted solder paste to form a solder joint. The flat end sections 684, 686 on the solder mass 654 are located close enough to the printed wiring board to promote easy soldering and allows additional solder to accumulate between the flat end sections of the contact 120 and the solder paste to make the solder joint stronger. Since the contact 120 is penetrated into the solder paste, movement between the contact 120 and the solder paste is reduced during the reflow process. The at least partially melted solder mass 654 collects at the rounded point 134 at the first end of the contact 120.

FIG. 30 shows a ninth embodiment of the invention. This embodiment shows and alternate shape for the solder mass 754. The solder mass 754 has a circular edge instead of the "wolf's head" shape shown in the eighth embodiment. Like that of the eighth embodiment, the solder mass 754 overhangs the end of the contact 120 to provide an over-stress protection feature as discussed with regard to the eighth embodiment.

Attention is invited to the tenth embodiment of the invention shown in FIGS. 31 and 32.

The contact 120 used in the tenth embodiment is substantially identical to the contact 120 in the second embodiment, and therefore only the differences are described herein. Otherwise, like reference numerals are used for like elements.

The aperture 136 provided through the tail 124 in the second embodiment has been eliminated. Instead, the solder mass 854 is stapled to the tail 124 of the contact 120. Each straight side edges 131, 133 of the tail 124 has a cutout 839, 841 along the length of the respective side edge 131, 133.

After the formation of the contacts 120, a strip of solder material, which may be formed from a tin alloy, is provided. A blanking and marriage punch and associated die are used to punch plurality of predefined shapes from the strip of solder material. The predefined shape has a main body 859 generally shaped like a "wolf head", with arms 861, 863 extending therefrom. The predefined shape has a top edge 856, side edges 858, 860, arm 861 extends outwardly from side edge 858, arm 863 extends outwardly from side edge 860, and a bottom edge 862. The side edges 858, 260 are straight and are generally perpendicular to the top edge 856. The bottom edge 862 has generally flat end sections 884, 886 with an intermediate section therebetween. The flat end sections 884, 886 are generally perpendicular to the side edges 858, 860 and generally parallel to the top edge 856. The intermediate section is formed from a first surface 888 and a second surface 890 which respectively taper towards each other to a rounded end 892 from the end sections 884, 886. The first and second surfaces 888, 890 and the rounded end 892 form a point.

The attachment of one of the solder elements to its respective contact 120 is described, with the understanding that the other solder elements are connected to the respective contacts 120 in an identical manner and at the same time. The main body 859 is engaged against one side of the tail 124 of the contact 120 to form a solder element. The edges 884, 886, 888, 890, 892 extend beyond the rounded point 132 on the tail 124 along the axis of the contact 120. While the bottom edges 884, 886, 888, 890, 892 extend beyond the rounded point 132 on the tail 124, it is to be understood that these edges can align or can be recessed from the edges of the contact 120.

The arms 861, 863 are bent to wrap around the tail 124 by suitable means, and engaged within the cutouts 839, 841. The ends of the arms 861, 863 will then be on the opposite side of the tail 124 relative to the main body 859 of the solder element. This mechanically secures the solder element to the contact 120 and completes the contact assembly. This forms a solder mass 854 on the tail 124 of the contact 120. A heavier solder mass 854 can be used versus prior art balls since the solder mass 854 is stapled to the contact 120. The solder mass 854 is assembled to the contact 120 in a controlled process as opposed to the prior art which uses loose balls.

While two arms 861, 863 are shown and described, it is within the scope of the invention to provide only a single arm that wraps around the tail 124 of the contact 120 or more than two arms.

Next, the strip of contacts 120 with the solder masses 854 provided thereon are inserted into the wafer. The carriers between the contacts 120 are then removed by suitable means such that individual contacts 120 are formed and held by the wafer. The wafer and the contacts 120 are inserted into a connector assembly (not shown) for connection to a mating contact and to a printed wiring board (not shown). The tails 124 of the contacts 120 extend from the connector assembly for mating with the printed wiring board.

These steps are preferably carried out in a continuous line assembly.

The printed wiring board is conventionally formed and includes conductive pads (not shown) for mating with the tails of the contacts. A solder paste deposit (not shown) is provided on each pad.

To mate each of the contacts 120 having the solder mass 854 thereon with the printed wiring board, the solder mass 854 is moved against the conductive pad and is at least partially immersed into the solder paste. The rounded point 892 of the solder mass 854 acts as a penetrator into the solder paste and preferably engages against the conductive pad when the contact 120 is fully engaged with the printed wiring board (some solder paste may remain preventing the actual engagement of the tail of the contact and the pad).

The printed wiring board may not be completely flat and may have variability in the co-planarity of the conductive pads. The engagement of the tail rounded point 892 of the solder mass 854 and the conductive pad aids in minimizing soldering issues associated with a lack of co-planarity because the solder mass 854 penetrates into the solder paste deposit and may have actual contact with the conductive pad, rather than sitting on top of the solder paste as occurs with solder balls. A co-planarity tolerance approximately equal to the thickness of the solder paste deposit on the conductive pad is thereby provided.

Next, a reflow process permanently mates the solder paste and the solder mass 854. During the reflow process, the solder mass 854 at least partially melts and melds with the melted solder paste to form a solder joint. The flat end sections 884, 886 on the solder mass 854 are located close enough to the printed wiring board to promote easy soldering and allows additional solder to accumulate between the flat end sections of the contact 120 and the solder paste to make the solder joint stronger. Since the contact 120 is penetrated into the solder paste, movement between the contact 120 and the solder paste is reduced during the reflow process. The at least partially melted solder mass 854 collects at the rounded point 134 at the first end of the contact 120.

In each of these embodiments, the solder mass is mechanically secured to the contact without fusing same. The solder mass is not fused to the contact as in the prior art where the solder balls are fused to the end of the contact.

While the embodiments of the contacts have been described with regard to a strip of contacts, it is to be understood that the method can be used to form contacts one at a time.

It is to be understood that the aperture 402 can be provided in the contacts 20, 120 of the other embodiments to obtain the same benefits.

While preferred embodiments of the present invention are shown and described, it is envisioned that those skilled in the art may devise various modifications of the present invention without departing from the spirit and scope of the appended claims.

What is claimed is:

1. A method comprising the steps of:
providing a solder element that includes a penetrator, wherein the solder element includes a first flat end section and a second flat end section, the penetrator extends from the first flat end section and is positioned between the first and second flat end sections and the solder element includes a body;
providing a contact with a body that has a first and second edge, the contact including a mating edge that is positioned between the first and second edge and configured to engage a conductive pad on a circuit board when the contact is coupled to the circuit board, the contact including an aperture defined by an aperture edge that is positioned between the first and second and is spaced apart from the mating edge so that the aperture edge is separated from the mating edge by a portion of the body that extends between the first and second edge; and
mechanically attaching the solder element to the contact without fusing the solder element to the contact, the mechanical attaching causing the penetrator of the solder element to extend beyond the mating edge of the contact, wherein the solder element is positioned on a first side of the contact and the mechanical attaching causes a shank to extend from the body and to be pressed through the aperture, the mechanical attaching causing an end of the shank to be mushroomed so that the shank is retained in the aperture and wherein the terminal includes a third flat end section and the first flat end section of the solder element overlaps the third flat end section of the terminal.

2. A contact assembly formed in accordance with the method of claim 1.

3. A method as defined in claim 1, wherein the shank is extended through the aperture by using a punch and an associated die to form a mushroom-shaped deformation on a portion of the shank pressed into the aperture.

4. A contact assembly formed in accordance with the method of claim 3.

5. A method as defined in claim 1, wherein the solder element body has a rectangular shape with a triangular-shaped penetrator extending from the rectangular shape.

6. A contact assembly formed in accordance with the method of claim 5.

7. A method as defined in claim 1, further including the step of shearing the shank from the contact.

8. A connector comprising:

an insulation portion;

a terminal supported by the insulation portion, the terminal including a curved end portion with a mating edge and an aperture defined by an aperture edge that is spaced apart and distinct from the mating edge so that the aperture edge is internal to the terminal and is separated from the mating edge by a portion of the terminal; and a solder element mechanically mounted to the aperture in the terminal, the solder element including a penetrator that overlaps the curved end portion; the penetrator configured, in operation, to pierce solder paste when the connector is mounted on a circuit board wherein the solder element includes a first flat end section and a second flat end section, the penetrator extends from the first flat end section and is positioned between the first and second flat end sections, the solder element includes a body with a shank extending from the body, the shank positioned in the aperture and an end of the shank is mushroomed so that the shank is retained in the aperture; and wherein the terminal includes a third flat end section and the first flat end section of the solder element overlaps the third flat end section of the terminal.

9. The connector of claim 8, wherein the insulation portion comprises a wafer and the terminal is a first terminal and the solder element is a first solder element with a first penetrator, the first terminal supported by the wafer, the connector further comprising:

a second terminal spaced apart from the first terminal and supported by the wafer, the second terminal including a second curved end portion with a mating edge and a second aperture defined by a second aperture edge that is spaced apart and distinct from the mating edge of the second curved end portion; and a second solder element mechanically mounted to the second aperture the second terminal, the second solder element including a second penetrator that overlaps the second curved end portion; the second penetrator configured, in operation, to pierce solder paste when the connector is mounted on the circuit board.

10. The connector of claim 8, wherein the solder element body has a rectangular shape body with a triangular-shaped penetrator extending from the rectangular body.

11. The connector of claim 8, wherein the penetrator is wedge-shaped with a rounded point.

* * * * *